(12) United States Patent
Chen et al.

(10) Patent No.: US 6,252,260 B1
(45) Date of Patent: Jun. 26, 2001

(54) ELECTRODE STRUCTURE OF HETERO-JUNCTION INTERTAL PHOTO-EMISSION INREARED DETECTOR

(75) Inventors: Peiyi Chen; Peixin Qian; Ruizhong Wang, all of Beijing (CH)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/105,281

(22) Filed: Jun. 26, 1998

(51) Int. Cl.[7] .................... H01L 29/41; H01L 31/0312

(52) U.S. Cl. .................... 257/184; 257/449; 257/452; 257/459; 257/457

(58) Field of Search ...................... 257/184, 449, 257/455, 456, 457, 459, 452

(56) References Cited

U.S. PATENT DOCUMENTS 4,544,939 * 10/1985 Kosonochy .................... 257/452
5,163,179 * 11/1992 Pellegrini ...................... 257/452

* cited by examiner

Primary Examiner—Jerome Jackson, Jr.

(57) ABSTRACT

An electrode structure of an HIP infrared detector. A HIP infrared comprises a p-type silicon substrate which has an exposed guard ring, an exposed region of the silicon substrate encompassed by the guard ring, and a silicon oxide layer covering a part of the guard ring and the silicon substrate. On the silicon substrate, a photosensitive alloy layer comprises an amorphous photosensitive alloy layer on the silicon oxide layer, and a single crystalline photosensitive alloy layer on both the part of the silicon substrate encompassed by the guard ring and the guard ring. An electrode to electrically connects the silicon substrate via the photosensitive alloy layer. Moreover, the HIP infrared further comprises a p[+] Ohmic contact in the silicon substrate and another electrode to contact with the p[+] Ohmic contact.

12 Claims, 1 Drawing Sheet

US 6,252,260 B1

ELECTRODE STRUCTURE OF HETERO-JUNCTION INTERTAL PHOTO-EMISSION INREARED DETECTOR

BACKGROUND OF THE INVENTION

1. Field of the Invention

The invention relates in general to an electrode structure of an infrared detector, and more particularly, to an electrode structure of a hetero-junction internal photo-emission (HIP) infrared detector.

2. Description of the Related Art

As the development of military science and radiotelemetry technique become more and more advanced, the application by employing an infrared focal array (FPA) is more and more important. An intensive research has been directed towards the infrared detector with a wavelength of about 8 $\mu$m to 14 $\mu$m due to its high sensitivity against the object temperature nearby.

In Appl. Phys. Lett., 1990, 57(14), T. L. Lin and J. Maserjian have disclosed a $p^{+-Ge_x}Si_{1-x}/p$-Si HIP infrared detector as shown in FIG. 1. The detector comprises a p-type silicon substrate 100. In the p-type substrate 100, a $p^+$ contact 102 for Ohmic contact and an $n^+$ guard ring 104 are formed. A silicon oxide layer 106 is formed and defined on the p-type silicon substrate 100. As shown in the figure, a central part of the $p^+$ contact 102, an inner part of the guard ring 104, and a region 108 of the $p^+$ silicon substrate 100 which is encompassed by the guard ring 104 are exposed. A $p^+$-$Ge_xSi_{1-x}$/p-Si layer 110 is formed on the exposed guard ring 104 and the exposed $p^+$ silicon substrate 100. An aluminum layer is formed and defined. Therefore, an aluminum (Al) electrode 112a covers the exposed $p^+$ contact 102 and a part of the silicon oxide layer 106. Another Al electrode 112b is formed on a part of the $p^+$-$Ge_xSi_{1-x}$/p-Si layer 110 at a region aligned over the silicon oxide layer 106.

In the above structure, since the aluminum electrode 112b does not directly contact with the silicon substrate 100, therefore, the spike effect between aluminum and silicon is avoided. As a consequence, the leakage current is reduced and suppressed. However, there are two drawbacks of the structure:

1) The thickness of the $Ge_xSi_{1-x}$ layer is as thin as about 100 nm, so that the silicon oxide layer 106 as an insulation has to be as thin as possible to avoid the $Ge_xSi_{1-x}$ layer to break in the step region. However, considering the dielectric property, the silicon oxide layer has to maintain a certain thickness. Furthermore, while cleaning the $Ge_xSi_{1-x}$ layer during patterning, a part of the silicon oxide layer is removed by the cleaning solution, for example, HF. Therefore, a very high manufacturing cost is required to control the thickness of the silicon oxide layer during cleaning process for the $Ge_xSi_{1-x}$ layer and growing process of silicon oxide layer.

2) The region of the $Ge_xSi_{1-x}$ layer over the silicon oxide layer is in an amorphous state. Therefore, a poor conductivity is obtained, and a parasitic resistance is formed to affect the performance of the device.

SUMMARY OF THE INVENTION

It is therefore an object of the invention to provide an electrode structure of an HIP infrared detector. In the detector, the electrode electrically connects the silicon substrate through a single crystalline photosensitive alloy. Therefore, the conductivity is improved. Furthermore, by forming an electrode on the photosensitive alloy layer aligned with the guard ring, without forming the electrode over the silicon substrate, the spike effect between the electrode and the silicon substrate is prevented.

To achieve these objects and advantages, and in accordance with the purpose of the invention, as embodied and broadly described herein, the invention is directed towards an electrode structure of an HIP infrared detector. A HIP infrared comprises a p-type silicon substrate which has an exposed guard ring, an exposed region of the silicon substrate encompassed by the guard ring, and a silicon oxide layer covering a part of the guard ring and the silicon substrate. On the silicon substrate, a photosensitive alloy layer comprises an amorphous photosensitive alloy layer on the silicon oxide layer, and a single crystalline photosensitive alloy layer on both the part of the silicon substrate encompassed by the guard ring and the guard ring. An electrode electrically connects the silicon substrate via the photosensitive alloy layer. Moreover, the HIP infrared further comprises a $p^+$ Ohmic contact in the silicon substrate and another electrode to contact with the $p^+$ Ohmic contact.

It is to be understood that both the foregoing general description and the following detailed description are exemplary and explanatory only and are not restrictive of the invention, as claimed.

DESCRIPTION OF THE PREFERRED EMBODIMENTS

In the invention, an electrode structure of an HIP infrared detector is disclosed. A part of the electrode is formed on a part of the single crystalline photosensitive alloy, therefore, the parasitic resistance is suppressed and the conductivity improved. A detailed description of the electrode structure is presented with reference to the accompanying drawings as follows.

Figure 2:
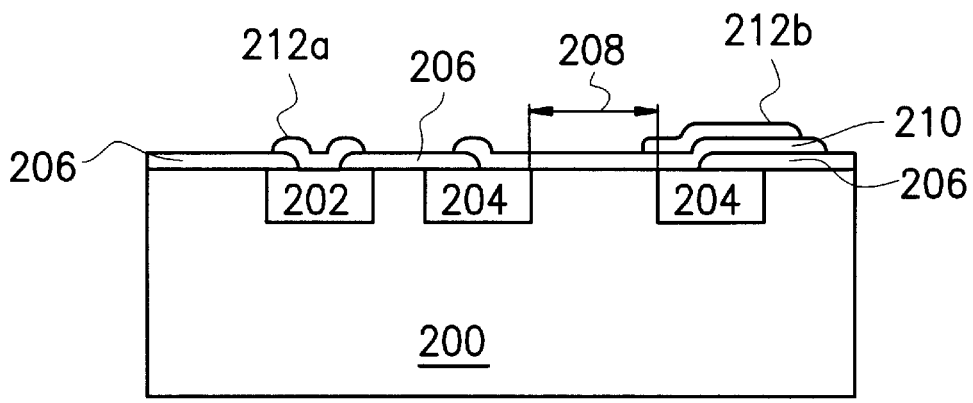
FIG. 2 is a cross sectional view, of which an electrode structure of an HIP infrared detector in a preferred embodiment according to the invention is shown.

In FIG. 2, a cross sectional view of an electrode structure of an HIP infrared detector in a first preferred embodiment according to the invention is shown. An HIP infrared detector comprises a p-type silicon substrate 200. In the silicon substrate 200, a $p^+$ Ohmic contact 202 and a $n^+$ guard ring 204 are formed. A silicon oxide layer 206 having a thickness of about hundreds of nanometers is formed and patterned on the silicon substrate 200. As a result, a central part of the $p^+$ Ohmic contact 202, an inner part of the guard ring 204, and a part of silicon substrate 208 encompassed by the guard ring 204 are exposed. A photosensitive alloy layer 210 having a thickness less than about 100 nm, for example, germanium silicon alloy, platinum silicon alloy, or titanium silicon alloy, is formed on the exposed silicon substrate 208, of the exposed guard ring 204, and a part of the silicon oxide layer 206. It is known that the photosensitive alloy layer 210 has various states while being formed on different kinds of materials. More specifically, the photosensitive alloy layer 210 formed on the exposed silicon substrate 208 and the guard ring 204 has a single crystalline state, whereas the photosensitive alloy layer 210 formed on silicon oxide layer 206 has an amorphous state.

An aluminium layer with a thickness of about 1 μm is formed and patterned over the silicon substrate 200. As a result, an electrode 212a formed of the aluminium layer directly contacting the p⁺ Ohmic contact 202 is formed, and an electrode 212b is formed of the aluminium layer to contact the photosensitive alloy layer 210 on the silicon oxide layer 206, the exposed silicon substrate 208 and the guard ring 204. Therefore, the electrode 212b does not electrically connect the silicon substrate 200 via an amorphous photosensitive alloy only, but also via a single crystalline photosensitive alloy. The conductivity of the single crystalline photosensitive alloy is much better than the amorphous photosensitive alloy. As a consequence, the infrared detector has an improved performance and reliability.

In the above embodiment, the performance and reliability are improved for an infrared detector since the electrode electrically connects the silicon substrate via both amorphous and single crystalline photosensitive alloy. One drawback of the embodiment is that since the photosensitive alloy layer is very thin, the aluminum atom of the electrode can easily penetrate through the photosensitive alloy layer due to a mutual diffusion between the electrode and the silicon substrate, and therefore, an aluminum spike is caused in the bulk silicon substrate and the guard ring in the silicon substrate.

If an aluminum spike is caused within a guard ring, the leakage is absorbed by the guard ring, so that the device is not degraded by the spike effect. On the contrary, if the aluminum spike is cause in the bulk silicon substrate, the leakage current directly affects the quality and performance of the device. Therefore, in a second embodiment, to eliminate the drawback of the first embodiment, the electrode is formed on the amorphous photosensitive alloy layer and the crystalline photosensitive layer align with the guard ring. That is, the electrode does not cover any photosensitive layer directly covering the silicon substrate apart from the guard ring In FIG. 3, a cross sectional view of an electrode structure of an HIP infrared detector in a first preferred embodiment according to the invention is shown. An HIP infrared detector comprises a p-type silicon substrate 300. In the silicon substrate 300, a p⁺ Ohmic contact 302 and an n⁺ guard ring 304 are formed. A silicon oxide layer 306 having a thickness of about hundreds of nanometers is formed and patterned on the silicon substrate 300. As a result, a central part of the p⁺ Ohmic contact 302, an inner part of the guard ring 304, and a part of silicon substrate 308 encompassed by the guard ring 304 are exposed. A photosensitive alloy layer 310 having a thickness less than about 100 nm, for example, germanium silicon alloy, platinum silicon alloy, or titanium silicon alloy, is formed on the exposed silicon substrate 308, the exposed guard ring 304, and a part of the silicon oxide layer 306. It has mentioned above that the photosensitive alloy layer 310 has various states while being formed on different kinds of materials. More specifically, the photosensitive alloy layer 310 formed on the exposed silicon substrate 308 and the guard ring 304 has a single crystalline state, whereas the photosensitive alloy layer 310 formed on silicon oxide layer 306 has an amorphous state.

An aluminium layer with a thickness of about 1 μm is formed and pattern over the silicon substrate 300. As a result, an electrode 312a formed of the aluminium layer directly contacting the p⁺ Ohmic contact 302 is formed, and an electrode 312b is formed of the aluminium layer to contact the photosensitive alloy layer 310 on the silicon oxide layer 306 and the guard ring 304. Therefore, the electrode 312b does not electrically connect the silicon substrate 300 via an amorphous photosensitive alloy only, but also via a single crystalline photosensitive alloy. The conductivity of the single crystalline photosensitive alloy is much better than the amorphous photosensitive alloy. As a consequence, the infrared detector has an improved performance and reliability. Moreover, the electrode 312b formed on the single crystalline photosensitive alloy layer 310 on the guard ring 304 only. In case of a spike effect, the leakage current is absorbed by the guard ring 304. The part of photosensitive alloy layer 310 on the bulk silicon substrate layer 308 is not covered by the electrode, therefore, spike effect is not caused in the bulk silicon substrate 300.

Figure 1:
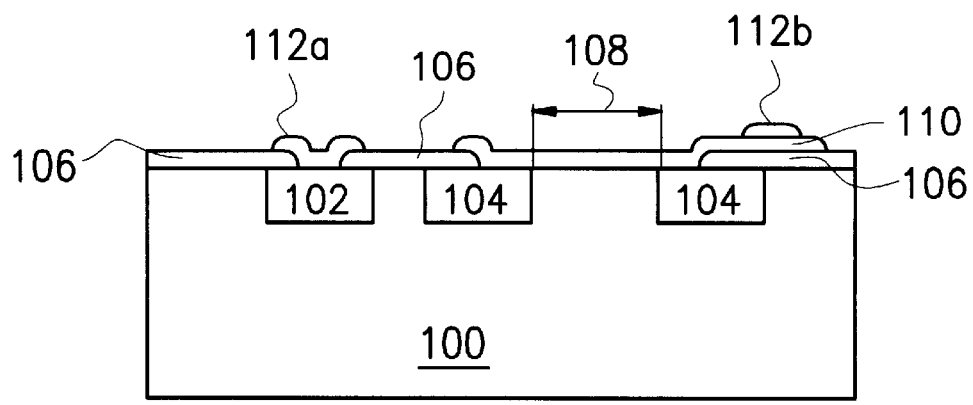
FIG. 1 is a cross sectional view, of which a conventional electrode structure of an HIP infrared detector is shown.
Figure 3:
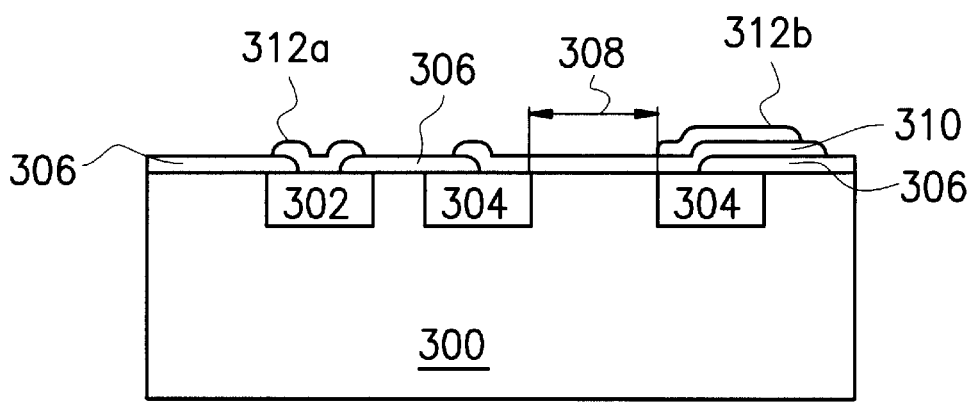
FIG. 3 is a cross sectional view, of which an electrode structure of an HIP infrared detector in another preferred embodiment according to the invention is shown.

A comparison of signal voltage ($\mu$V), noise voltage (nV) (ENBW=1 Hz), ratio of it signal to noise (S/N) ratio, and detection depth D between a black body emission at 500° K and the conventional detector (denoted as A) shown in FIG. 1 at 77° K, a black body emission at 500° K and the detector (denoted as B) according to the invention shown in FIG. 2 at 77° K, and a black body emission at 500° K and the detector (denoted as C) shown in FIG. 3 at 77° K, are shown as Table 1. The detectors are applied with a zero bias, and the diameter of the black body is 3 mm.

TABLE 1

| Detector | Signal Voltage $V_s$ ($\mu$V) | Noise Voltage $V_n$ (nV) | S/N Ratio $V_s/V_n$ | Detection Depth D (cmHz$^{1/2}$/W) |
|---|---|---|---|---|
| A | 0.430 | 22.0 | 19.5 | $1.5 \times 10^8$ |
| B | 0.050 | 10.0 | 5.0 | $3.9 \times 10^7$ |
| C | 0.450 | 17.0 | 26.5 | $2.0 \times 10^8$ |

It is known from Table 1 that:
1) The detection depth is deepest for detector C.
2) The signal voltage of A is higher than it the detectors B and C due to the affection of a parasitic serial resistance.
3) The noise voltage of detector B is higher than it of the detectors A and C due to the affection of a leakage current caused by spike effect.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An electrode structure of a hetero-junction infrared detector, wherein a p-type substrate comprising an exposed guard ring, an exposed region of the silicon substrate encompassed by the guard ring, and a silicon oxide layer covering a part of the guard ring and of the silicon substrate excluding the exposed region encompassed by the guard ring is provided, the electrode structure comprising:

a photosensitive alloy layer, comprising an amorphous photosensitive alloy layer on the silicon oxide layer, and a single crystalline photosensitive alloy layer on both the part of the exposed silicon substrate encompassed by the guard ring and the guard ring; and an electrode, formed on the amorphous photo-sensitive alloy layer on the silicon oxide layer, and the crystalline photosensitive alloy layer on the guard ring and the part of the silicon substrate encompassed by the guard ring to electrically connect the silicon substrate.

2. The electrode structure according to claim 1, wherein the second electrode covers both a part of the amorphous photosensitive alloy layer and a part of the single crystalline photosensitive layer.

3. The electrode structure according to claim 1, wherein the second electrode covers both a part of the amorphous photosensitive alloy layer and a part of the single crystalline photosensitive layer on the guard ring only.

4. The electrode structure according to claim 1, wherein the photosensitive alloy layer comprises a germanium silicon alloy.

5. The electrode structure according to claim 1, wherein the photosensitive alloy layer comprises a platinum silicon alloy.

6. The electrode structure according to claim 1, wherein the photosensitive alloy layer comprises a titanium silicon alloy.

7. The electrode structure according to claim 1, wherein the photosensitive alloy has a thickness less than about 100 nm.

8. The electrode structure according to claim 1, wherein the silicon substrate further comprises a $p^+$ Ohmic contact contacted with another electrode formed thereon.

9. An hetero-junction infrared detector, comprising:
   a p-type silicon substrate;
   a $p^+$ Ohmic contact, formed in the silicon substrate;
   an $n^+$ guard ring, formed in another part of the silicon substrate;
   a silicon oxide layer, formed and patterned on the silicon substrate to exposed a central part of the $p^+$ Ohmic contact, a part of the silicon substrate encompassed by the $n^+$ guard ring, and an inner part of the guard ring;
   a photosensitive alloy layer, comprising an amorphous photosensitive alloy layer on the silicon oxide layer, and a single crystalline photosensitive alloy layer on both the part of the silicon substrate encompassed by the guard ring and the inner part of the guard ring;
   a first electrode, to contact the $p^+$ Ohmic contact; and
   a second electrode, to electrically connect the silicon substrate via the single crystalline photosensitive alloy layer, wherein the second electrode covers a portion of the amorphous photosensitive alloy layer on the silicon oxide layer and a portion of the single crystalline photosensitive alloy layer.

10. The detector according to claim 9, wherein the second electrode covers both a part of the amorphous photosensitive alloy layer and a part of the single crystalline photosensitive layer.

11. The detector according to claim 9, wherein the second electrode covers both a part of the amorphous photosensitive alloy layer and a part of the single crystalline photosensitive layer on the guard ring only.

12. The detector according to claim 9, wherein the photosensitive alloy has a thickness less than about 100 nm.

* * * * *